(12) United States Patent
Monson et al.

(10) Patent No.: US 11,317,542 B2
(45) Date of Patent: Apr. 26, 2022

(54) TECHNOLOGIES FOR IMPROVING PROCESSOR THERMAL DESIGN POWER

(71) Applicant: Intel Corporation, Santa Clara, CA (US)

(72) Inventors: Blaine Monson, Mesa, AZ (US); Pankaj Kumar, Chandler, AZ (US); Steven Miller, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 15/859,392

(22) Filed: Dec. 30, 2017

(65) Prior Publication Data

US 2019/0045668 A1 Feb. 7, 2019

(51) Int. Cl.
*H05K 7/20* (2006.01)
*H05K 7/14* (2006.01)

(52) U.S. Cl.
CPC ....... *H05K 7/20745* (2013.01); *H05K 7/1487* (2013.01); *H05K 7/20727* (2013.01); *H05K 7/20736* (2013.01); *H05K 7/20836* (2013.01); *H05K 7/1489* (2013.01); *H05K 7/1498* (2013.01)

(58) Field of Classification Search
CPC .......... H05K 7/20136; H05K 7/20554; H05K 7/20736; H05K 7/20836; H05K 7/1489; H05K 7/1485; H05K 7/1487; H05K 7/1488
USPC ........ 454/184; 361/679.46, 679.47, 688, 831
See application file for complete search history.

(56) References Cited

U.S. PATENT DOCUMENTS

| | | | |
|---|---|---|---|
| 10,356,495 B2 | 7/2019 | Adiletta et al. | |
| 2008/0192431 A1* | 8/2008 | Bechtolsheim | G06F 1/20 361/695 |
| 2014/0016268 A1* | 1/2014 | Tsujimura | H05K 7/20727 361/695 |
| 2014/0063721 A1* | 3/2014 | Herman | H05K 7/1487 361/679.31 |
| 2014/0085813 A1* | 3/2014 | Sedarous | C09K 5/00 361/679.54 |
| 2014/0240921 A1* | 8/2014 | Sultenfuss | G06F 1/20 361/679.54 |
| 2015/0264832 A1* | 9/2015 | Jau | H05K 7/1492 361/679.02 |
| 2017/0269871 A1* | 9/2017 | Khan | G06F 3/0673 |
| 2019/0069434 A1 | 2/2019 | Aoki | |

OTHER PUBLICATIONS

EDN, "What does 1U, 2U or 3U mean?", https://www.edn.com/what-does-1u-2u-or-3u-mean, Apr. 3, 2013, 3 pages.

* cited by examiner

*Primary Examiner* — Vivek K Shirsat
*Assistant Examiner* — Ko-Wei Lin
(74) *Attorney, Agent, or Firm* — Compass IP Law PC

(57) ABSTRACT

A compute device for operation in a rack of a data center includes a substrate, a solid state drive array, a fan array, and a plurality of physical resources. The components of the compute device are arranged on the substrate to prevent or reduce shadowing of heat-producing physical resources, such as a processor, by other heat-producing physical resources relative to an airflow generated by the fan array. To do so, ruler solid state drives are used to facilitate positioning of the fan array toward a front edge of the substrate.

22 Claims, 5 Drawing Sheets

TECHNOLOGIES FOR IMPROVING PROCESSOR THERMAL DESIGN POWER

BACKGROUND

Typical enterprise-level data centers can include several to hundreds of racks or cabinets, with each rack/cabinet housing multiple servers, sleds, or similar compute devices. Each of the various servers of a data center may be communicatively connectable to each other via one or more local networking switches, routers, and/or other interconnecting devices, cables, and/or interfaces. The number of racks and servers of a particular data center, as well as the complexity of the design of the data center, may depend on the intended use of the data center, as well as the quality of service the data center is intended to provide.

Traditional rack systems are self-contained physical support structures that include a number of pre-defined server spaces. A corresponding server or compute device may be mounted in each pre-defined server space. When mounted in the server space, it may be desirable to dissipate heat produced by various components of the server during operation to improve performance of those components. Dissipation of heat produced by the various components may be complicated by the arrangement of multiple heat-producing components of the server.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
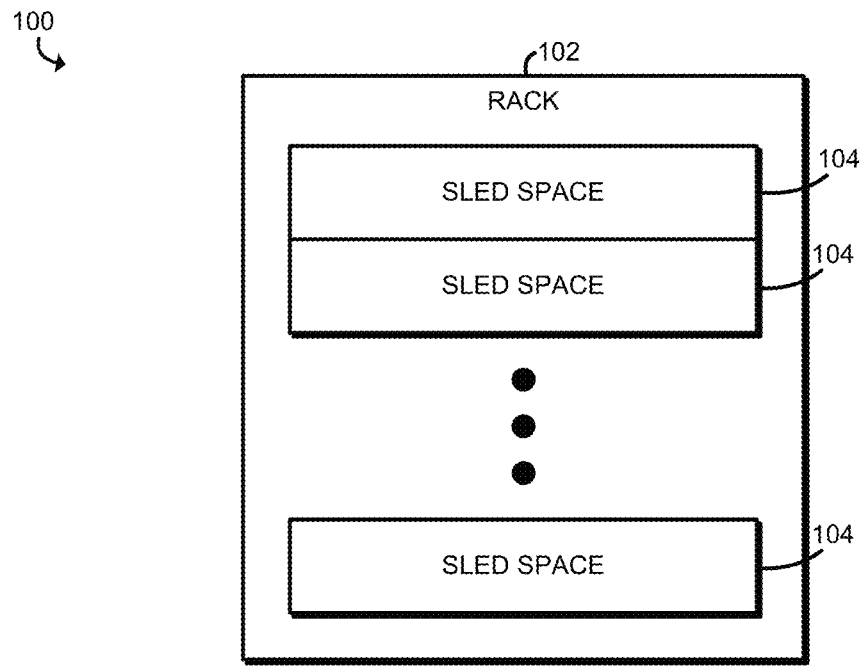
FIG. 1 is a simplified block diagram of at least one embodiment of a rack that may be included in a corresponding data center.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative data center 100 may be generally representative of a data center or other type of computing network or collection of computing resources. Although the data center 100 is shown to include a single rack 102, it should be appreciated that the data center 100 may include multiple racks, which may be substantially identical to the rack 102. For example, in some embodiments, multiple racks 102 may be secured together to form a row of racks 102 and/or a pod of racks 102. Each rack 102 is configured to house one or more servers, sleds, or other computer equipment, which are illustratively embodied as compute devices 200 (see FIG. 2). To that end, each rack 102 includes a plurality of server spaces 104, each of which is sized to receive a corresponding compute device 200. Although the rack 102 is shown to include three server spaces 104, it should be appreciated that the rack 102 may include additional or fewer server spaces 104 in other embodiments depending on, for example, the desired number of compute devices 200 to be housed.

Figure 2:
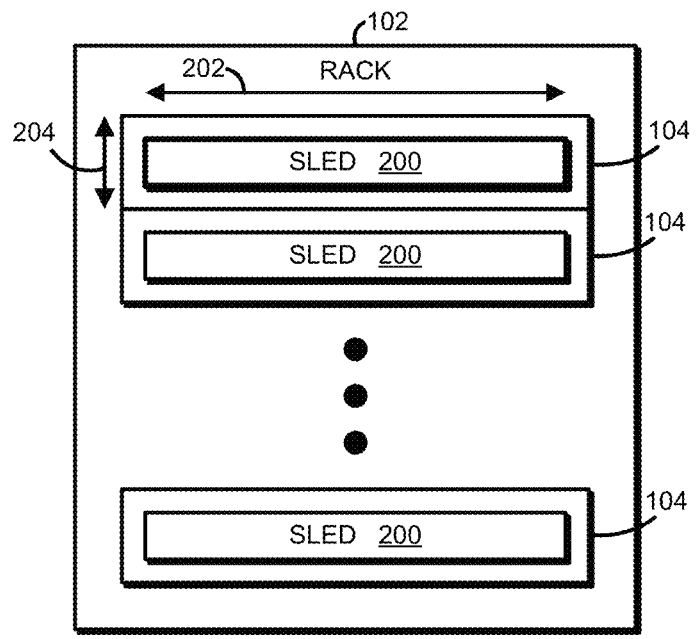
FIG. 2 is a simplified block diagram of the rack of FIG. 1 with multiple compute devices installed in the rack.

Referring now to FIG. 2, each compute device 200 is illustratively received by a corresponding server space 104 such that each compute device 200 is supported by the rack 102. The rack 102 may include physical design features that facilitate the automation of a variety of maintenance tasks.

For example, in some embodiments, the rack 102 may be robotically-accessed such that the compute devices 200 may be installed into, and removed from, the server spaces 104 by a robot for servicing, upgrading, and/or replacement.

In the illustrative embodiment, each server space 104 of the rack 102 has a "1U" configuration. That is, each server space 104 is sized for receiving a corresponding compute device or server 200 having "1U" dimensions. For example, in the illustrative embodiment, each server space 104 of the rack 102 is sized to receive compute devices 200 having a width 202 of about 19 inches. Additionally, each of the server spaces 104 has a height 204 of about 1.75 inches. Of course, it should be appreciated that the rack 102 may meet certain industry standards, and include certain industry features, such as the standards defined in EIA-310-D by the Electronics Industries Alliance, for example.

Regardless, it should be appreciated that the size of the server spaces 104 and the relative close proximity of the compute devices 200 mounted therein may adversely impact the cooling of the compute devices 200. Furthermore, as discussed in more detail below in regard to FIG. 3, each compute device 200 includes physical resources, such as various electrical devices, circuits, and other components that generate or produce heat during operation, such as when each compute device 200 is installed in one of the server spaces 104. As such, to improve cooling of particular physical resources of the compute device 200 (e.g., processors of the compute device 200), some of the physical resources are arranged relative to each other to reduce or eliminate thermal shadowing (i.e., the configuration in which one component is in-line with another component along a linear airflow path such that air moving along the airflow path may be heated by heat produced by the one component before moving to the another component) of those particular physical resources. Consequently, the performance of some of those physical resources may be increased because, among other things, those physical resources (e.g., processors) may have greater thermal design power due to improved cooling than might otherwise be the case if the components were arranged in a shadowed configuration. For example, as discussed in more detail in regard to FIG. 4 below, the illustrative compute device 200 includes a data storage array centrally located with a pair of fan arrays mounted on either side of the data storage array. Such a configuration ensures that corresponding processors of the compute device 200 are not thermally shadowed by other heat-producing physical resources of the compute device 200 (i.e., other physical resources or components that produce a non-nominal or non-minimal amount of heat sufficient enough to adversely impact the cooling of the processors) with respect to the linear airflow generated by the fan arrays. As such, the cooling of the processors of the compute device 200 may be improved, and the power envelope of those processors may likewise be increased in some embodiments.

Figure 3:
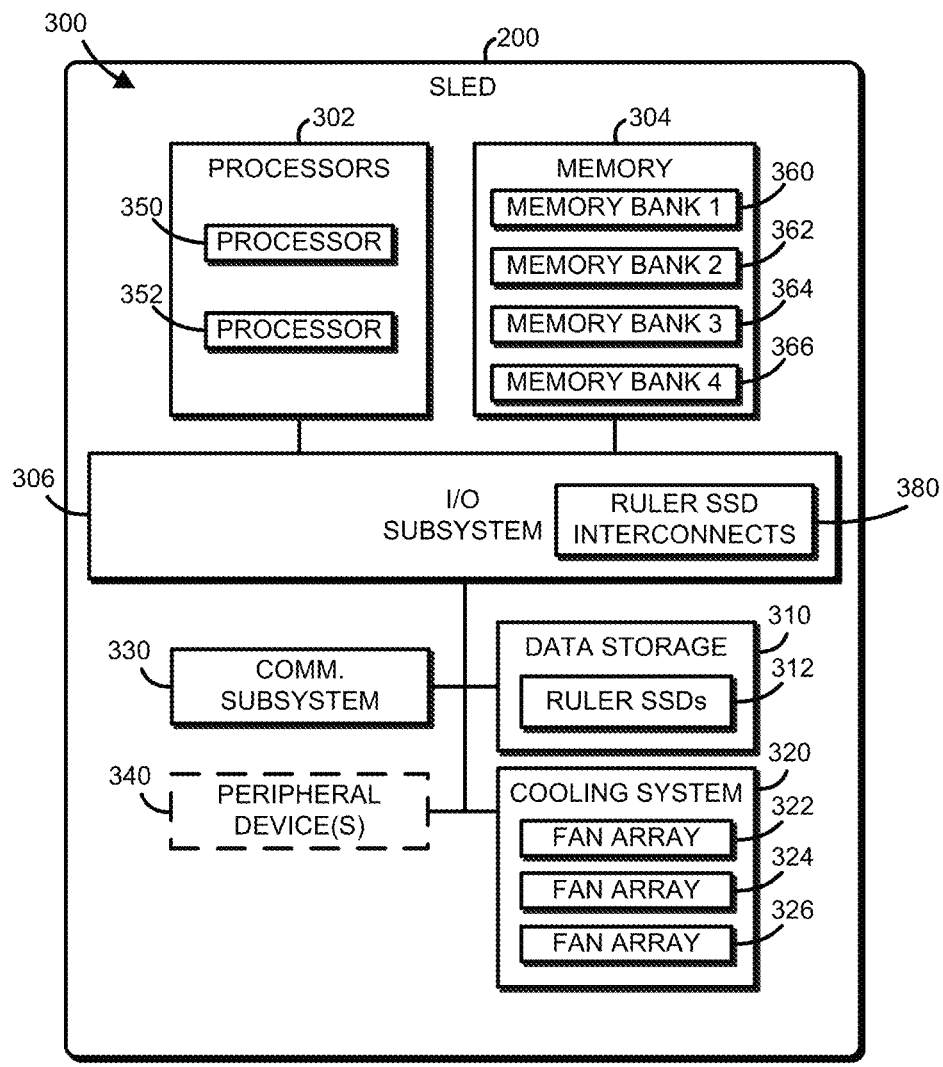
FIG. 3 is a simplified block diagram of at least one embodiment of a compute device that may be installed in the rack of FIG. 2.

Referring now to FIG. 3, each compute device 200 may be embodied as any type of server, sled, computer, or other compute device capable of performing various compute functions and being mounted in the rack 102. As shown in FIG. 3, the illustrative compute device 200 includes various physical resources 300 including one or more processors 302, a memory 304, an input/output (I/O) subsystem 306, a data storage array 310, a cooling system 320, and a communication subsystem 330. Of course, in other embodiments, the compute device 200 may include other or additional components, such as those commonly found in a computer (e.g., display, peripheral devices, etc.). Additionally, in some embodiments, one or more of the illustrative components may be incorporated in, or otherwise form a portion of, another component.

Each of the processors 302 may be embodied as any type of processor, controller, or other compute circuit capable of performing various tasks such as compute functions and/or controlling the functions of the compute device 200 depending on, for example, the type or intended functionality of the compute device 200. For example, the processor 302 may be embodied as a single or multi-core processor(s), a microcontroller, or other processor or processing/controlling circuit. In some embodiments, the processor 302 may be embodied as, include, or be coupled to an FPGA, an application specific integrated circuit (ASIC), reconfigurable hardware or hardware circuitry, or other specialized hardware to facilitate performance of the functions described herein. For example, the processors 302 may be embodied as high-power processors in embodiments in which the compute device 200 is embodied as a compute server, as accelerator co-processors, FPGAs, or other circuits in embodiments in which the compute device 200 is embodied as an accelerator server, and/or as storage controllers in embodiments in which the compute device 200 is embodied as a storage server. In the illustrative embodiment, the processors 302 include two processors 350, 352. However, in other embodiments, the compute device 200 may include additional processors 302.

The memory 304 may be embodied as any type of volatile (e.g., dynamic random access memory (DRAM), etc.) or non-volatile memory capable of storing data therein. Volatile memory may be embodied as a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

In some embodiments, the memory 304 is embodied as a block addressable memory, such as those based on NAND or NOR technologies. The memory 304 may also include future generation nonvolatile devices, such as a three dimensional crosspoint memory device (e.g., Intel 3D XPoint™ memory), or other byte addressable write-in-place nonvolatile memory devices. In some embodiments, the memory 304 may be embodied as or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In some embodiments, 3D crosspoint memory (e.g., Intel 3D XPoint™ memory) may comprise a transistor-less stackable cross point architecture in which memory cells sit at the intersection of word lines and bit lines and are individually addressable and in which bit storage is based on a change in bulk resistance.

In the illustrative embodiment, the memory 304 includes multiple memory banks 360, 362, 364, 366, which may be embodied as a collection of memory devices. Each memory bank may be associated with a corresponding processor 350, 352 of the processors 302. Additionally, in some embodiments, all or a portion of the memory 304 may be integrated into the processor(s) 302. In operation, the memory 304 may store various software and data used during operation such as task request data, kernel map data, telemetry data, applications, programs, libraries, and drivers.

The illustrative processors 302 and memory 304 are communicatively coupled to other components of the compute device 200 via the I/O subsystem 306, which may be embodied as circuitry and/or components to facilitate input/output operations with the processors 302 and the memory 304. For example, the I/O subsystem 306 may include, or otherwise be embodied as, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 306 may be incorporated, along with one or more of the processors 302 and one or more of the memory devices 304, into a compute engine of the compute device 200.

The data storage array 310 may be embodied as any type of data storage device or collection of devices capable of short-term or long-term storage of data such as solid state drives and may utilize any suitable type of data storage technology (e.g., NAND memory devices). In the illustrative embodiment, the data storage devices 310 are embodied as solid state drives (SSDs) 312 that each have a "ruler" form factor, which are referred to herein as ruler solid state drives 312 (ruler SSDs). The "ruler form factor is generally taller, thinner, and longer than other data storage device form factors. For example, in the illustrative embodiment, each ruler SSD 312 has a height when mounted in the upright position of about 38.66 millimeters, a width of about 9.9 millimeters, and a depth or length of about 162 millimeters or 324 millimeters, depending on the particular embodiment. Due to the size of the "ruler" form factor, each of the ruler SSD 312 is capable of use in the 1U sled space 104 of the rack 102 when mounted in an upright position. As such, as discussed in more detail below, the "ruler" form factor allows the ruler SSD 312 to be mounted in the compute device 200 such that the data storage array 310 does not extend completely across the width of the compute device 200, which allows room to mount fan arrays of the cooling system 320 on either side of the data storage array 310 and facilitates sufficient air flow to cool the processors 350, 352 even when operating at a higher thermal design power (TDP).

Accordingly, compared to solid state drives having other form factors such as those with 5.25-inch, 3.5-inch, or 2.5-inch form factor, the ruler solid state drives 312 provide a greater storage capacity (e.g., a 30% greater storage capacity) in a smaller form factor. Consequently, each sled 200 may include a smaller number of drives 312 than might otherwise be required if each sled 200 utilized solid state drives having other form factors. Additionally, as discussed in more detail below, the form factor of the ruler SSDs 312 allows the ruler SSDs 312 to be positioned toward the front of the sled 200, in front of the processors 302 and memory 304. Such positioning allows the cooling system 320 to cool the processors 302 and memory 304 while also avoiding thermal shadowing those physical resources of the sled 200.

The illustrative cooling system 320 may include, or otherwise be embodied as, any device or collection of devices capable of dissipating heat produced by one or more other physical resource of the compute device 200, such as the processors 302. In the illustrative embodiment, the cooling system 320 includes fan arrays 322, 324, 326, each of which includes multiple fans capable of generating an airflow over heat-producing physical resources (e.g., the processors 302) of the compute device 200 to dissipate the heat produced by those components during operation of each compute device 200. Of course, it should be appreciated that in other embodiments, the cooling system 320 may include additional cooling device to help dissipate heat produced by the heat-producing physical resources, such as conduits, manifolds, cold plates, heat exchangers, pumps, valves, sensors, etc.

The communication subsystem 330 may be embodied as any type of communication circuit, device, or collection thereof, capable of enabling communications between the compute device 200 and other remote compute devices. To do so, the communication subsystem 330 may be configured to use any one or more communication technologies (e.g., wireless or wired communications) and associated protocols (e.g., Ethernet, Bluetooth®, Wi-Fi®, WiMAX, LTE, 5G, etc.). In some embodiments, the communication subsystem 330 may be embodied as, or otherwise include, a network interface controller.

In some embodiments, the compute device 200 may also include one or more peripheral devices 340. The peripheral devices 340 may include any number of additional peripheral or interface devices, such as input/output devices, storage devices, accelerator devices, and so forth. The particular devices included in the peripheral devices 340 may depend on, for example, the type and/or configuration of each compute device 200.

Figure 5:
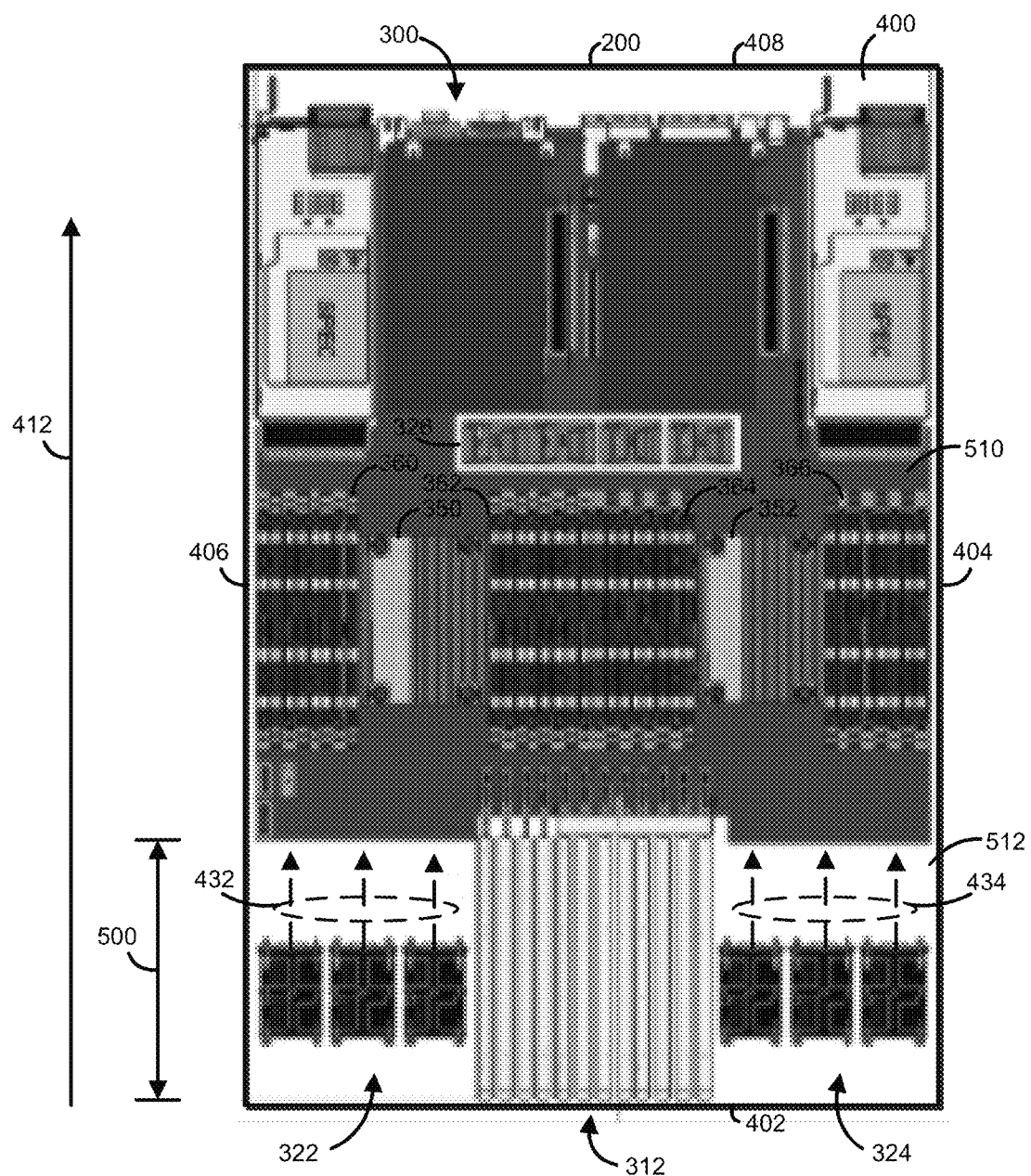
FIG. 5 is a top view diagram of an embodiment of the compute device of FIG. 3 showing various components of the compute device mounted on a corresponding substrate of the compute device similar to the compute device shown in FIG. 4.
Figure 6:
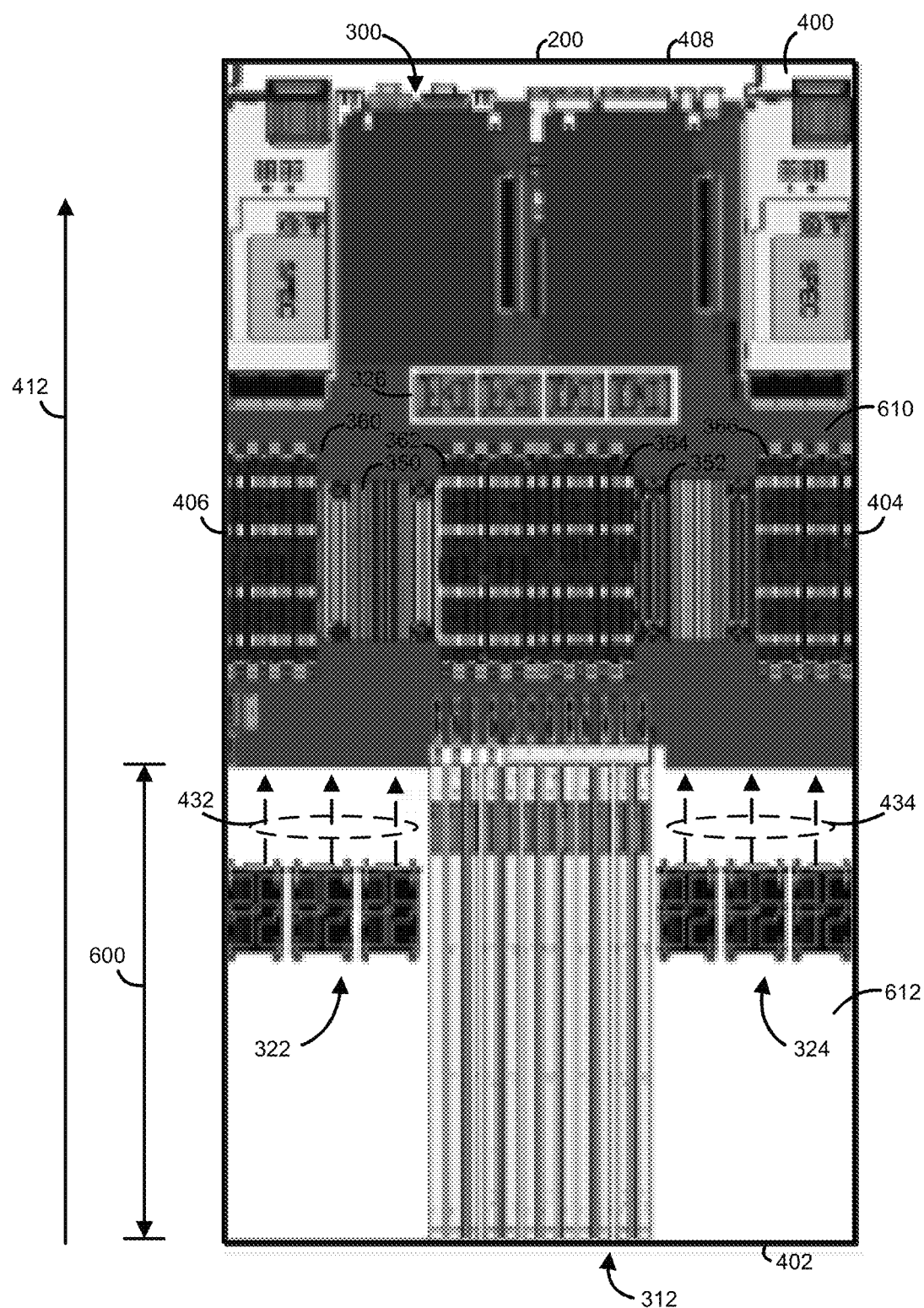
FIG. 6 is a top view diagram of another embodiment of the compute device of FIG. 3 showing various components of the compute device mounted on a corresponding substrate of the compute device similar to the compute device shown in FIG. 4.

It should be appreciated that some of the physical resources 300 of the compute device 200, such as the processors 302, are heat-producing electrical components capable of producing a substantive, non-nominal amount of heat during operation. Put another way, heat-producing electrical components of the physical resources 300 may be defined as any electrical component that produces a sufficient amount of heat to adversely impact the operation of another electrical component, which may include another heat-producing electrical component. To improve the cooling of some of those heat-producing electrical components of the compute device 200, the physical resources 300 of the compute device 200 are arranged such that particular heat-producing electronic components (e.g., the processors 302) are not shadowed by other heat-producing electrical components relative to a linear airflow generated by the fan arrays 322, 324. In particular and as shown in FIGS. 4-6, due to the relative small form factor of the ruler solid state drives 312, the ruler solid state drive array 312 and the fan arrays 322, 324 may be positioned laterally in-line with each other such that the linear airflow generated by the fan arrays 322, 324 is directed toward particular physical resources, such as the processors 302, with no shadowing of those physical resources by other heat-producing electrical components (i.e., other physical resources or components that produce a non-nominal or non-minimal amount of heat sufficient enough to adversely impact the cooling of the particular physical resources).

Figure 4:
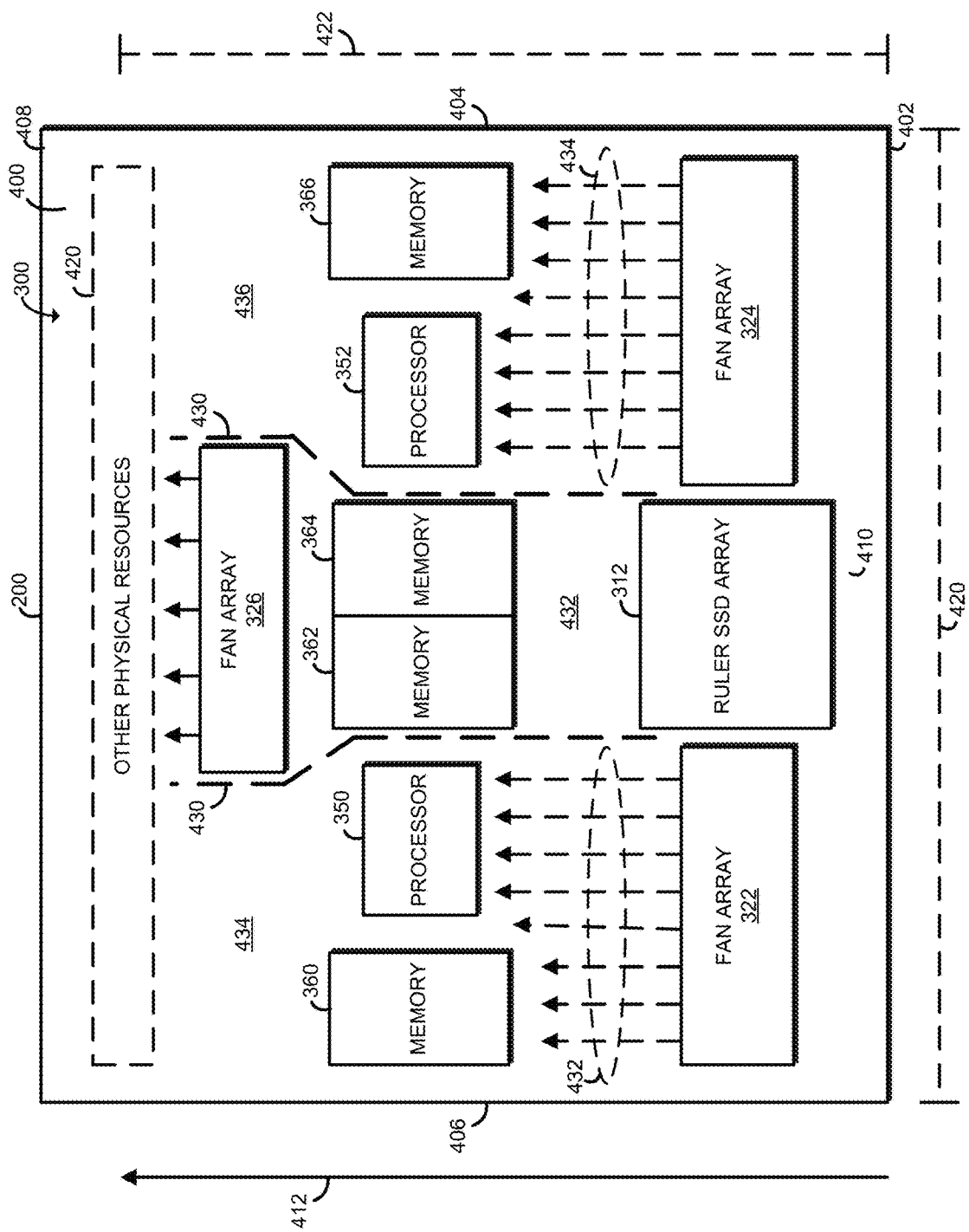
FIG. 4 is a simplified block diagram of a conceptual layout of various components of the compute device of FIG. 3 mounted to a substrate of the compute device.

Referring now to FIG. 4, as discussed above, the physical resources 300 of the compute device 200 are mounted and/or arranged on a substrate 400 of the compute device 200 relative to each other to reduce or eliminate thermal shadowing of particular physical resources. In particular, because each solid state drive of the SSD array 312 has a "ruler" form factor, the ruler SSD array 312 and the fan arrays 322, 324 may be positioned in-line with each other relative to a direction 410 extending from a side edge 404 to an opposing side edge 406. The ruler SSD array 312 and the fan arrays 322, 324 are mounted toward a front edge 402 of the substrate 400, and the processors 350, 352 and memory banks 360, 362, 364, 366 are mounted to the substrate 400 behind the ruler SSD array 312 and the fan arrays 322, 324 relative to a direction 412 that extends from the front edge 402 to a rear edge 408 of the substrate 400. Illustratively, the ruler SSD array 312 is centrally positioned toward the front edge 402 with the fan array 322 mounted in-line between the ruler SSD array 312 and the side edge 406 and the other fan array 324 mounted in-line with between the ruler SSD array 312 and the other side edge 404. The fan array 326 is mounted toward the rear edge 408 behind the memory banks 362, 364 relative to the direction 412 to pull air across the memory banks 362, 364.

Illustratively, the substrate 400 of the compute device 200 is enclosed in a chassis or housing, but may be embodied as a chassis-less circuit board substrate in other embodiments. Additionally, in some embodiments, a single chassis may enclosure multiple substrates 400. Illustratively, the substrate 400 has a width 420 of about 16.732 inches and a length 422 of about 23.982 inches, but may have other dimensions in other embodiments (e.g., see FIG. 6) based on, for example, the size of the server space 104 and/or rack 102. The substrate 400 is illustratively formed from an FR4 glass-reinforced epoxy laminate material or other similar material. In some embodiments, the substrate 400 may include a primary substrate (not shown) that is separate from, but coupled to, a secondary substrate (now shown) or mounting surface of the chassis as discussed in more detail below in regard to FIG. 6. In such embodiments, the primary substrate may be formed from an FR4 glass-reinforced epoxy laminate material, and the secondary substrate may be formed from other materials, such as from metallic materials capable of supporting the ruler SSD array 312, for example. Additionally, in such embodiments, the processors 350, 352 and the memory banks 360, 362, 364, 366 may be mounted on the primary substrate, whereas the ruler SSD array 312 and the fan arrays 322, 324 may be mounted on the secondary substrate. Of course, in other embodiments such as conceptual embodied of FIG. 4, it should be appreciated that the substrate 400 may be a monolithic structure on which the processors 350, 352, the memory banks 360, 362, 364, 366, the ruler SSD array 312, and the fan arrays 322, 324 are mounted and which is formed from an FR4 glass-reinforced epoxy laminate material or another suitable material.

Because the ruler SSD array 312 is centrally located toward the front edge 402 of the substrate 400 and in-line with the fan arrays 322, 324, the processors 350, 352 may be mounted behind the fan array 322, 324 in a location such that the processors 350, 352 are not thermally shadowed by any other heat-producing physical resource (e.g., the SSDs 312 themselves) of the compute device 200. Put differently, no other heat-producing electrical component of the physical resources 300 of the compute device 200 (i.e., other physical resources or components that produce a non-nominal or non-minimal amount of heat sufficient enough to adversely impact the cooling of other physical resources) is positioned between the processors 350, 352 and the corresponding fan array 322, 324 and in-line with an airflow 432, 434 generated by the fan arrays 322, 324, respectively. In particular, it should be appreciated that the ruler SSD array 312 is positioned such that the array 312 is not within the airflow 432, 434 generated by the fan arrays 322, 324 and, as such, does no thermally shadow the processors 350, 352.

Additionally, in some embodiments, the compute device 200 may include ducting 430 to direct airflow generated by the fan arrays 322, 324, and/or 326. In the illustrative embodiment, the ducting 430 bounds the ruler SSD array 321, the memory banks 362, 364 and the fan array 326 to create a central airflow region 432 that includes the memory banks 362, 364, a left airflow region 434 that includes the memory bank 360 and the processor 350, and a right airflow region 436 that includes the memory bank 366 and the processor 352. The ducting 430 may be formed from any suitable material such as a plastic material and pneumatically separates the airflow regions 432, 434, 436 such that the fan arrays 322, 324, 326 do not adversely impact the cooling of each other. For example, in some embodiments, the fan arrays 322, 324 may generate more air pressure than the fan array 326, which could reduce the efficiency of the fan array 326 without the ducting 430.

Due in part to the non-shadowed configuration of the processors 350, 352 (and ducting 430 in some embodiments), heat produced by the processors 350, 352 may be dissipated to a greater degree than heat is dissipated in other configurations (e.g., a configuration in which the processors 350, 352 are thermally shadowed by other heat-producing physical resources). As such, the thermal design power (TDP) of the processors 350, 352, which may be said to be the maximum amount of heat produced by those components that may be dissipated under any given workload to allow for proper operation of the components, may be increased compared to the other configurations. For example, in the illustrative embodiment, the processors 350, 352 have a thermal design power of about 240 Watts during operation.

Due to the increased thermal design power of the illustrative processors 350, 352, the performance of the processors 350, 352 may be increased compared to the performance of similar components in other configurations, such those in which the processors 350, 352 are thermally shadowed. For example, in the illustrative embodiment, the thermal design power of the processors 350, 352 may allow increases in core count, memory capacity per core, and/or core frequencies to be achieved, which may be associated with greater processing power than provided by processors in other thermally shadowed configurations. Such increased processing power may be desirable in applications wherein rack density utilization, compute optimization, and direct-attached-storage considerations apply, such as in High Performance Computing (HPC), Hyper-Converged Infrastructure (HCI), and Network Function Virtualization (NFV) platforms.

Additionally, due to the form factor of the ruler SSD array 312, the compute device 200 is capable of use in the 1U configuration of the server spaces 104 of the rack 102 described above with reference to FIG. 2. In some embodiments, solid state drives having form factors different from the ruler form factor of the ruler SSD array 312 may be used in combination with interfaces that may require a configuration different from the illustrative 1U configuration of the compute device 200 to provide desired storage capacity. For example, solid state drives having form factors different from the ruler form factor of the ruler SSD arrays 312 may be used in combination with one or more U.2 interfaces (e.g., a 2.5-inch form factor) that may require a 2U configuration (i.e., a server space of about 3.5 inches) to provide desired storage capacity via a NAND flash memory device.

Furthermore, the use of the illustrative ruler SSD array 312 in conjunction with the processors 350, 352 may in part permit, or otherwise be associated with, decreased latency of the processors 350, 352 compared to the latency of similar components in other configurations. In the illustrative embodiment, the positioning of the ruler SSD array 312, the fan arrays 322, 324, and 326, and the processors 350, 352 facilitates the direct communicative coupling of the ruler SSD array 312 to the processors 350, 352 using corresponding interconnects 380 of the I/O subsystem 306 (see FIG. 3), which may be embodied as, or otherwise include, peripheral component interconnect express (PCIe) technologies. For example in typical server devices, the included fan arrays are positioned such that the included storage drive array are separated from the included processors such that bridge boards or cable assemblies are required to couple the processors to the storage drive array. Conversely, the direct connection of the ruler SSD array 312 to the processors 350, 352 by the interconnects 380 avoids the use of PCIe switches and/or retimers that may be required in configurations using bridge boards or cable assemblies to establish interconnection and which may be associated with increased latency of computing devices. As such, direct connection of the ruler SSD array 312 to the processors 350, 352 by the interconnects 380 avoids the use of cables, cable connectors, and/or backplanes which may be required in other configurations.

Additionally, the use of the illustrative ruler SSD array 312 may in part permit, or otherwise be associated with, greater workload capability of the processors 350, 352 compared to the workload capability of processors in other configurations, such as configurations in which solid state drives having form factors different from the ruler form factor of the ruler SSD array 312 are employed. For example, in typical dual processor server devices, each processor may be connected to only a subset of drives of the included storage drive array. Conversely, in the illustrative embodiments, each processors 350, 352 may be communicatively coupled to each ruler SSD of the ruler SSD array 312. As a result, each processor 350, 352 may utilize more SSDs of the ruler SSD array 312 to perform various tasks over a given time period relative to traditional server designs.

Referring now to FIG. 5, an illustrative embodiment of a physical layout of the compute device 200 is shown. As discussed above and illustratively shown in FIG. 5, the processors 350, 352 and the memory banks 360, 362, 364, 366 are mounted to the substrate 400 behind the fan arrays 322, 324 and the ruler SSD array 312, along the direction 412, such that the processors 350, 352 and the memory banks 360, 362, 364, 366 are not thermally shadowed by other heat-producing electrical components of the physical resources 300 of the compute device 200. That is, no other heat-producing physical resource (i.e., other physical resources that produce a non-nominal or non-minimal amount of heat sufficient enough to adversely impact the cooling of other physical resources) is mounted to the substrate 400 in-line with the airflow 432, 434 generated by the fan arrays 322, 324 in front of the processors 350, 352 and the memory banks 360, 362, 364, 366. Additionally, the fan array 326 is mounted toward the rear edge 408 behind the memory banks 362, 364 relative to the direction 412 to pull air across the memory banks 362, 364. Again, as discussed above, the compute device 200 may include the ducting 430 (see FIG. 4) in some embodiments.

In the illustrative embodiment of FIG. 5, each ruler SSD of the ruler SSD array 312 has a length or depth 500 of about 6 inches. To support the ruler SSD array 312 having that length, the illustrative substrate 400 is sized to have a width 420 of about 16.732 inches and a length 422 of about 23.982, but may have other dimensions in other embodiments. The substrate 400 of the embodiment of FIG. 6 includes a primary substrate 510 and a separate second substrate 512, which is coupled to the primary substrate 510. The ruler SSD array 312 and the fan arrays 322, 324 are mounted on the secondary substrate 512, whereas the processors 350, 352, the memory banks 360, 362, 364, 366, and the remaining physical resources of the compute device 200 are mounted on the primary substrate 510. In the illustrative embodiment, the primary substrate 510 is be formed from an FR4 glass-reinforced epoxy laminate material, and the secondary substrate 512 may be formed from a metallic material to support the mounting of the ruler SSD array 312 and the fan arrays 322, 324. Of course, in other embodiments, it should be appreciated that the substrate 400 may be a monolithic structure on which the processors 350, 352, the memory banks 360, 362, 364, 366, the ruler SSD array 312, and the fan arrays 322, 324 are mounted.

Referring now to FIG. 6, another illustrative embodiment of a physical layout of the compute device 200 is shown. As discussed above and illustratively shown in FIG. 6, the processors 350, 352 and the memory banks 360, 362, 364, 366 are mounted to the substrate 400 behind the fan arrays 322, 324 and the ruler SSD array 312, along the direction 412, such that the processors 350, 352 and the memory banks 360, 362, 364, 366 are not thermally shadowed by other heat-producing electrical components of the physical resources 300 of the compute device 200. That is, no other heat-producing physical resource (i.e., other physical resources that produce a non-nominal or non-minimal amount of heat sufficient enough to adversely impact the cooling of other physical resources) is mounted to the substrate 400 in-line with the airflow 432, 434 generated by the fan arrays 322, 324 in front of the processors 350, 352 and the memory banks 360, 362, 364, 366. Additionally, the fan array 326 is mounted toward the rear edge 408 behind the memory banks 362, 364 relative to the direction 412 to pull air across the memory banks 362, 364. Again, as discussed above, the compute device 200 may include the ducting 430 (see FIG. 4) in some embodiments.

In the illustrative embodiment of FIG. 6, each ruler SSD of the ruler SSD array 312 has a length or depth 600 of about 12 inches. To support the ruler SSD array 312 having that length, the illustrative substrate 400 is sized to have a width 420 of about 16.732 inches and a length 422 of about 29.982, but may have other dimensions in other embodiments. The substrate 400 of the embodiment of FIG. 6 includes a primary substrate 610 and a separate second substrate 612, which is coupled to the primary substrate 610. The ruler SSD array 312 and the fan arrays 322, 324 are mounted on the secondary substrate 612, whereas the processors 350, 352, the memory banks 360, 362, 364, 366, and the remaining physical resources of the compute device 200 are mounted on the primary substrate 610. In the illustrative embodiment, the primary substrate 610 is be formed from an FR4 glass-reinforced epoxy laminate material, and the secondary substrate 612 may be formed from a metallic material to support the mounting of the ruler SSD array 312 and the fan arrays 322, 324. Of course, in other embodiments, it should be appreciated that the substrate 400 may be a monolithic structure on which the processors 350, 352, the memory banks 360, 362, 364, 366, the ruler SSD array 312, and the fan arrays 322, 324 are mounted.

As shown in the embodiments of FIGS. 5 and 6, it should be appreciated that the dimensions of the compute device 200 (e.g., the length) may be adjusted or alerted depending on the desired storage capacity of the ruler SSD array 312. That is, the dimensions of the ruler SSD 312 (i.e., the length of the ruler SSD arrays 312 in the directions 412) may be increased to provide a particular storage capacity. Although such adjustment may entail a modification to the dimensions of the substrate 400 (e.g., the lengths of the secondary substrates 512, 612 may need to be increased), such an adjustment may not affect or require modification of the primary substrates 510, 610. Thus, in the illustrative embodiments of FIGS. 5 and 6, the ruler SSD array 312 may be sized based on the desired storage capacity (as well as the space availability of the server space 104 of the rack 102) without modification to, or repositioning of, the components mounted to the primary substrates 510, 610.

EXAMPLES

Illustrative examples of the technologies disclosed herein are provided below. An embodiment of the technologies may include any one or more, and any combination of, the examples described below.

Example 1 includes a compute device for operation in a rack of a data center. The compute device includes a substrate having a front edge, a rear edge opposite the front edge, and a pair of opposing side edges that each extend between the front edge and the rear edge; a solid state drive array mounted to the substrate toward the front edge, wherein the solid state drive array comprises a plurality of solid state drives; a fan array mounted to the substrate toward the front edge and in-line with the solid state drive array along a direction that extends from one opposing side edge to the other opposing side edge; and a plurality of physical resources mounted to the substrate, wherein the plurality of physical resources include a processor mounted to the substrate behind the fan array relative to the front edge along a direction that extends from the front edge to the rear edge such that no other heat-producing electrical component of the compute device shadows the processor along a direction of airflow that extends from the fan array toward the rear edge of the substrate.

Example 2 includes the subject matter of Example 1, and wherein the plurality of solid state drives comprises a plurality of ruler solid state drives.

Example 3 includes the subject matter of Examples 1 or 2, and wherein each of the plurality of ruler solid state drives has height, relative to the substrate, of about 1.75 inches.

Example 4 includes the subject matter of any of Examples 1-3, and wherein the fan array comprises a first fan array mounted to the substrate between one side edge of the pair of opposing side edges and the solid state drive array.

Example 5 includes the subject matter of any of Examples 1-4, and further includes a second fan array mounted to the substrate between the other side edge of the pair of opposing side edges and the solid state drive array.

Example 6 includes the subject matter of any of Examples 1-5, and wherein plurality of physical resources further comprises a memory device mounted to the substrate in-line with the solid state drive array along a direction that extends from the front edge to the rear edge, and further includes a third fan array third fan array mounted to the substrate behind the memory device along the direction that extends from the front edge to the rear edge.

Example 7 includes the subject matter of any of Examples 1-6, and wherein the processor comprises a first processor mounted to the substrate behind the first fan array relative to the front edge.

Example 8 includes the subject matter of any of Examples 1-7, and further includes a second processor mounted to the substrate behind the second fan array relative to the front edge.

Example 9 includes the subject matter of any of Examples 1-8, and wherein the first processor is mounted to the substrate behind the first fan array such that no other electrical component of the compute device that produces non-nominal heat during operation shadows the first processor along a direction of airflow that extends from the first fan array toward the rear edge of the substrate.

Example 10 includes the subject matter of any of Examples 1-39, and wherein the second processor is mounted to the substrate behind the second fan array such that no other electrical component of the compute device that produces non-nominal heat during operation shadows the second processor along a direction of airflow that extends from the second fan array toward the rear edge of the substrate.

Example 11 includes the subject matter of any of Examples 1-10, and wherein the fan array comprises a first fan array and a second fan array spaced from the first fan array along the direction that extends from the one opposing side edge to the other opposing side edge, and wherein the solid state drive array is mounted to the substrate between the first fan array and the second fan array.

Example 12 includes the subject matter of any of Examples 1-11, and wherein the plurality of physical resources further comprises a plurality of memory devices mounted to the substrate behind the first fan array and the second fan array relative to the front edge, wherein the plurality of memory devices include a first memory device mounted to the substrate in-line with the solid state drive array along a direction that extends from the front edge to the rear edge.

Example 13 includes the subject matter of any of Examples 1-12, and wherein the plurality of memory devices further comprises a second memory device mounted to the substrate in-line with one of the first fan array or the second fan array along the direction that extends from the front edge to the rear edge.

Example 14 includes the subject matter of any of Examples 1-13, and wherein the plurality of memory devices further comprises a third memory device mounted to the substrate in-line with the other one of the first fan array or the second fan array along the direction that extends from the front edge to the rear edge.

Example 15 includes the subject matter of any of Examples 1-14, and wherein the compute device has a height of about 1.75 inches.

Example 16 includes the subject matter of any of Examples 1-15, and wherein each opposing side edge has a length of about 23.982 inches.

Example 17 includes the subject matter of any of Examples 1-16, and wherein each of the plurality of solid state drives has a length of about 6 inches.

Example 18 includes the subject matter of any of Examples 1-17, and wherein each opposing side edge has a length of about 29.982 inches.

Example 19 includes the subject matter of any of Examples 1-18, and wherein each of the plurality of solid state drives has a length of about 12 inches.

Example 20 includes the subject matter of any of Examples 1-19, and wherein the substrate comprises a chassis-less circuit board.

Example 21 includes the subject matter of any of Examples 1-20, and wherein the processor has a thermal design power of about 240 Watts.

Example 22 includes a compute device for operation in a rack of a data center. The compute device comprises a substrate having a front edge, a rear edge opposite the front edge, and a pair of opposing side edges that each extend between the front edge and the rear edge; a solid state drive array mounted to the substrate toward the front edge, wherein the solid state drive array comprises a plurality of ruler solid state drives; a fan array mounted to the substrate toward the front edge and in-line with the solid state drive array along a direction that extends from one opposing side edge to the other opposing side edge; and a plurality of physical resources mounted to the substrate, wherein the plurality of physical resources comprises a (i) first processor mounted to the substrate behind the fan array relative to the front edge along a direction that extends from the front edge to the rear edge such that no other electrical component of the compute device that produces non-nominal heat during operation shadows the first processor along a direction of airflow that extends from the fan array toward the rear edge of the substrate and (ii) a second processor mounted to the substrate behind the fan array relative to the front edge along the direction that extends from the front edge to the rear edge such that no other electrical component of the compute device that produces non-nominal heat during operation shadows the second processor along the direction of airflow that extends from the fan array toward the rear edge of the substrate.

Example 23 includes the subject matter of Example 22, and wherein each of the plurality of ruler solid state drives has height, relative to the substrate, of about 1.75 inches.

Example 24 includes the subject matter of Examples 22 or 23, and wherein the fan array comprises a first fan array mounted to the substrate between one side edge of the pair of opposing side edges and the solid state drive array, and further includes a second fan array mounted to the substrate between the other side edge of the pair of opposing side edges and the solid state drive array.

Example 25 includes the subject matter of any of Examples 22-24, and wherein plurality of physical resources further comprises a memory device mounted to the substrate in-line with the solid state drive array along a direction that extends from the front edge to the rear edge, and further includes a third fan array third fan array mounted to the substrate behind the memory device along the direction that extends from the front edge to the rear edge.

Example 26 includes the subject matter of any of Examples 22-25, and wherein the plurality of physical resources further comprises a plurality of memory devices mounted to the substrate behind the first fan array and the second fan array relative to the front edge, wherein the plurality of memory devices include a first memory device mounted to the substrate in-line with the solid state drive array along the direction that extends from the front edge to the rear edge.

Example 27 includes the subject matter of any of Examples 22-26, and wherein the plurality of memory devices further comprises a second memory device mounted to the substrate in-line with one of the first fan array or the second fan array along the direction that extends from the front edge to the rear edge.

Example 28 includes the subject matter of any of Examples 22-27, and wherein the plurality of memory devices further comprises a third memory device mounted to the substrate in-line with the other of the first fan array and the second fan array along the direction that extends from the front edge to the rear edge.

Example 29 includes the subject matter of any of Examples 22-28, and wherein each opposing side edge has a length of about 23.982 inches and each of the plurality of solid state drives has a length of about 6 inches.

Example 30 includes the subject matter of any of Examples 22-29, and wherein each opposing side edge has a length of about 23.982 inches and each of the plurality of solid state drives has a length of about 6 inches.

Example 31 includes the subject matter of any of Examples 22-30, and wherein each of the first and second processors has a thermal design power of about 240 Watts.

Example 32 includes a rack comprising a plurality of server spaces, wherein each server space is to receive a corresponding compute device and has a height of about 1.75 inches; and a plurality of compute devices, wherein each compute device is mounted in a corresponding server space of the plurality of server spaces and comprises: a substrate having a front edge, a rear edge opposite the front edge, and a pair of opposing side edges that each extend between the front edge and the rear edge; a solid state drive array mounted to the substrate toward the front edge, wherein the solid state drive array comprises a plurality of solid state drives; a fan array mounted to the substrate toward the front edge and in-line with the solid state drive array along a direction that extends from one opposing side edge to the other opposing side edge; and a plurality of physical resources mounted to the substrate, wherein the plurality of physical resources include a processor mounted to the substrate behind the fan array relative to the front edge along a direction that extends from the front edge to the rear edge such that no other heat-producing electrical component of each compute device shadows the processor along a direction of airflow that extends from the fan array toward the rear edge of the substrate.

Example 33 includes the subject matter of Example 32, and wherein the plurality of solid state drives of each compute device comprises a plurality of ruler solid state drives.

Example 34 includes the subject matter of Example 31 or 32, and wherein the fan array comprises a first fan array mounted to the substrate between one of the pair of opposing side edges and the solid state drive array, and wherein each compute device further comprises a second fan array mounted to the substrate between the other of the pair of opposing side edges and the solid state drive array.

Example 35 includes the subject matter of any of Examples 31-34, and wherein plurality of physical resources further comprises a memory device mounted to the substrate in-line with the solid state drive array along a direction that extends from the front edge to the rear edge, and further includes a third fan array third fan array mounted to the substrate behind the memory device along the direction that extends from the front edge to the rear edge.

Example 36 includes the subject matter of any of Examples 31-35, and wherein the processor of each compute device comprises a first processor mounted to the substrate behind the first fan array relative to the front edge, and wherein each compute device further includes a second processor mounted to the substrate behind the second fan array relative to the front edge.

Example 37 includes the subject matter of any of Examples 31-36, and wherein the first processor is mounted to the substrate behind the first fan array such that no other electrical component of each compute device that produces non-nominal heat during operation shadows the first processor along a direction of airflow that extends from the first fan array toward the rear edge of the substrate, and wherein the second processor is mounted to the substrate behind the second fan array such that no other electrical component of each compute device that produces non-nominal heat during operation shadows the second processor along a direction of airflow that extends from the second fan array toward the rear edge of the substrate.

Example 38 includes the subject matter of any of Examples 31-37, and wherein the plurality of physical resources of each compute device further comprises a plurality of memory devices mounted to the substrate behind the first fan array and the second fan array relative to the front edge, wherein the plurality of memory devices include a first memory device mounted to the substrate in-line with the solid state drive array along the direction that extends from the front edge to the rear edge.

Example 39 includes the subject matter of any of Examples 31-38, and wherein the plurality of memory devices further comprises a second memory device mounted to the substrate in-line with one of the first fan array and the second fan array along the direction that extends from the front edge to the rear edge.

Example 40 includes the subject matter of any of Examples 31-39, and wherein the plurality of memory devices further comprises a third memory device mounted to the substrate in-line with the other of the first fan array and the second fan array along the direction that extends from the front edge to the rear edge.

Example 41 includes the subject matter of any of Examples 31-40, and wherein each opposing side edge has a length of about 23.982 inches and each of the plurality of solid state drives has a length of about 6 inches.

Example 42 includes the subject matter of any of Examples 31-41, and wherein each opposing side edge has a length of about 29.982 inches and each of the plurality of solid state drives has a length of about 12 inches.

Example 43 includes the subject matter of any of Examples 31-42, and wherein the processor has a thermal design power of about 240 Watts.

The invention claimed is:

1. A compute device for operation in a rack of a data center, the compute device comprising:
    a substrate having a front edge, a rear edge opposite the front edge, and a pair of opposing side edges that each extend between the front edge and the rear edge;
    a solid state drive array mounted to the substrate, wherein the solid state drive array comprises a plurality of solid state drives;
    a fan array mounted to the substrate in-line with the solid state drive array along a direction that extends from one of the pair of opposing side edges to another of the pair of opposing side edges; and
    a plurality of physical resources mounted to the substrate, wherein the plurality of physical resources include a processor mounted to the substrate behind the fan array relative to the front edge along a direction that extends from the front edge to the rear edge along a direction of airflow that extends from the fan array toward the rear edge of the substrate, wherein the fan array comprises a first fan array and wherein the compute device further comprises a second fan array spaced from the first fan array along the direction that extends from the one of the pair of opposing side edges to the another of the pair of opposing side edges and wherein the solid state drive array is mounted to the substrate between the first fan array and the second fan array.

2. The compute device of claim 1, wherein the plurality of solid state drives comprises a plurality of ruler solid state drives.

3. The compute device of claim 1, wherein the first fan array is mounted to the substrate between one side edge of the pair of opposing side edges and the solid state drive array.

4. The compute device of claim 3, wherein the plurality of physical resources further comprises one or more memory devices mounted to the substrate in-line with the solid state drive array along the direction that extends from the front edge to the rear edge, and
    wherein the compute device further comprises a third fan array mounted to the substrate behind the one or more memory devices along the direction that extends from the front edge to the rear edge.

5. The compute device of claim 3, wherein the processor comprises a first processor mounted to the substrate behind the first fan array relative to the front edge, and
    wherein the compute device further comprises a second processor mounted to the substrate behind the second fan array relative to the front edge.

6. The compute device of claim 1, wherein the plurality of physical resources further comprises a plurality of memory devices mounted to the substrate behind the first fan array and the second fan array relative to the front edge, wherein the plurality of memory devices include (i) a first memory device mounted to the substrate in-line with the solid state drive array along the direction that extends from the front edge to the rear edge, (ii) a second memory device mounted to the substrate in-line with one of the first fan array or the second fan array along the direction that extends from the front edge to the rear edge, and (iii) a third memory device mounted to the substrate in-line with another one of the first fan array or the second fan array along the direction that extends from the front edge to the rear edge.

7. The compute device of claim 1, wherein the processor has a thermal design power of 240 Watts.

8. A compute device for operation in a rack of a data center, the compute device comprising:
    a substrate having a front edge, a rear edge opposite the front edge, and a pair of opposing side edges that each extend between the front edge and the rear edge;
    a solid state drive array mounted to the substrate, wherein the solid state drive array comprises a plurality of ruler solid state drives;
    a first fan array mounted to the substrate between one side edge of the pair of opposing side edges and the solid state drive array;
    a second fan array mounted to the substrate between another side edge of the pair of opposing side edges and the solid state drive array; and a plurality of physical resources mounted to the substrate, wherein the plurality of physical resources comprises a (i) first processor mounted to the substrate behind the first fan array relative to the front edge along a direction that extends from the front edge to the rear edge and (ii) a second processor mounted to the substrate behind the second fan array relative to the front edge along the direction that extends from the front edge to the rear edge.

9. The compute device of claim 8, wherein at least one of the plurality of ruler solid state drives has target height, relative to the substrate, of 1.75 inches.

10. The compute device of claim 8, wherein plurality of physical resources further comprises a memory device mounted to the substrate in-line with the solid state drive array along the direction that extends from the front edge to the rear edge, and
wherein the compute device further comprises a third fan array mounted to the substrate behind the memory device along the direction that extends from the front edge to the rear edge.

11. The compute device of claim 8, wherein the plurality of physical resources further comprises a plurality of memory devices mounted to the substrate behind the first fan array and the second fan array relative to the front edge, wherein the plurality of memory devices include a first memory device mounted to the substrate in-line with the solid state drive array along the direction that extends from the front edge to the rear edge.

12. The compute device of claim 11, wherein the plurality of memory devices further comprises a second memory device mounted to the substrate in-line with one of the first fan array or the second fan array along the direction that extends from the front edge to the rear edge.

13. The compute device of claim 12, wherein the plurality of memory devices further comprises a third memory device mounted to the substrate in-line with another of the first fan array and the second fan array along the direction that extends from the front edge to the rear edge.

14. The compute device of claim 8, wherein at least one of the plurality of ruler solid state drives has a target length of 6 inches and each of the first and second processors has a thermal design power of 240 Watts.

15. The compute device of claim 8, wherein at least one of the plurality of ruler solid state drives has a length of 12 inches and each of the first and second processors has a thermal design power of 240 Watts.

16. A rack comprising:
a plurality of server spaces; and
a plurality of compute devices, wherein at least one of the plurality of computer devices is mounted in a corresponding server space of the plurality of server spaces and comprises:
a substrate having a front edge, a rear edge opposite the front edge, and a pair of opposing side edges that each extend between the front edge and the rear edge;
a solid state drive array mounted to the substrate, wherein the solid state drive array comprises a plurality of solid state drives;
a fan array mounted to the substrate and in-line with the solid state drive array along a direction that extends from one opposing side edge to another opposing side edge, wherein the fan array comprises a first fan array mounted to the substrate between one of the pair of opposing side edges and the solid state drive array;
a second fan array mounted to the substrate between another of the pair of opposing side edges and the solid state drive array; and
a plurality of physical resources mounted to the substrate, wherein the plurality of physical resources include a processor mounted to the substrate behind the fan array relative to the front edge along a direction that extends from the front edge to the rear edge.

17. The rack of claim 16, wherein the plurality of solid state drives of the at least one of the plurality of compute devices comprises a plurality of ruler solid state drives.

18. The rack of claim 16, wherein for the at least one of the plurality of compute devices:
the plurality of physical resources further comprise a memory device mounted to the substrate in-line with the solid state drive array along the direction that extends from the front edge to the rear edge, and
the at least one of the plurality of compute devices further comprises a third fan array mounted to the substrate behind the memory device along the direction that extends from the front edge to the rear edge.

19. The rack of claim 16, wherein the processor of the at least one of the plurality of compute devices comprises a first processor mounted to the substrate behind the first fan array relative to the front edge, and
wherein the at least one of the plurality of compute devices further comprises a second processor mounted to the substrate behind the second fan array relative to the front edge.

20. The rack of claim 19, wherein for the at least one of the plurality of compute devices: the first processor is mounted to the substrate behind the first fan array and wherein the second processor is mounted to the substrate behind the second fan array.

21. The rack of claim 16, wherein for the at least one of the plurality of compute devices:
the plurality of physical resources further comprise a plurality of memory devices mounted to the substrate behind the first fan array and the second fan array relative to the front edge, wherein the plurality of memory devices include (i) a first memory device mounted to the substrate in-line with the solid state drive array along the direction that extends from the front edge to the rear edge, (ii) a second memory device mounted to the substrate in-line with one of the first fan array and the second fan array along the direction that extends from the front edge to the rear edge, and (iii) a third memory device mounted to the substrate in-line with another of the first fan array and the second fan array along the direction that extends from the front edge to the rear edge.

22. The rack of claim 16, wherein the processor has a thermal design power of 240 Watts.

* * * * *